(12) United States Patent
Vallet

(10) Patent No.: US 6,211,688 B1
(45) Date of Patent: Apr. 3, 2001

(54) TEST AREA WITH AUTOMATIC POSITIONING OF A MICROPROBE AND A METHOD OF PRODUCING SUCH A TEST AREA

(75) Inventor: Michel Vallet, Vaulnaveys le Haut (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/166,017

(22) Filed: Oct. 5, 1998

(30) Foreign Application Priority Data

Oct. 22, 1997 (FR) .................................................... 97 13233

(51) Int. Cl.[7] .............................. G01R 1/04; G01R 31/02
(52) U.S. Cl. ............................................. 324/758; 324/754
(58) Field of Search ..................................... 324/754, 758, 324/158.1; 438/800

(56) References Cited

U.S. PATENT DOCUMENTS

| | | | |
|---|---|---|---|
| 3,891,924 | * 6/1975 | Ardezzone et al. | 324/762 |
| 4,786,867 | 11/1988 | Yamatsu | 324/158 |
| 5,066,907 | * 11/1991 | Tarzwell et al. | 324/758 |
| 5,239,260 | * 8/1993 | Widder et al. | 324/758 |
| 5,274,575 | 12/1993 | Abe | 364/559 |

FOREIGN PATENT DOCUMENTS

| | | | |
|---|---|---|---|
| 0 325 269 A1 | 7/1989 | (EP) | G01R/31/28 |
| 03190148 | 8/1991 | (JP) . | |

* cited by examiner

Primary Examiner—Glenn W. Brown
(74) Attorney, Agent, or Firm—Theodore E. Galanthay; Allen, Dyer, Doppelt, Milbrath & Gilchrist, P.A.

(57) ABSTRACT

The invention relates to a test area of an electronic circuit comprising a contact point formed in the surface of a substrate. The test area also includes spaced apart radially extending bosses adjacent the contact point for guiding a test probe positioned on the surface of the substrate to the contact point.

24 Claims, 2 Drawing Sheets

TEST AREA WITH AUTOMATIC POSITIONING OF A MICROPROBE AND A METHOD OF PRODUCING SUCH A TEST AREA

FIELD OF THE INVENTION

The present invention relates to the field of electronics and microelectronics, and more particularly, to test areas for devices with integrated electronic circuits, and related methods.

BACKGROUND OF THE INVENTION

Test areas, generally formed on the surface of substrates are electrically connected to different parts of circuits in order to carry out checks on the correct operation of these circuits. The checks typically include measuring continuous control voltages at the test area and are carried out by means of microprobes. These microprobes are connected to suitable measurement equipment and are temporarily applied to contact points on the test area to carry out the measurements.

The known type of test areas for electronic circuits are in the form of metal contact points. These contact points, generally square in shape, have dimensions of the order of 20 $\mu$m×20 $\mu$m and are arranged on the surface of a substrate in which one or more electronic circuits are formed. The contact points are surrounded by an insulating layer called a passivation layer which forms a slight rounded mass in the surface of the substrate.

The contact points or pads can be connected to parts of an electronic circuit formed in the surface of the substrate, but also to parts of a circuit formed deep in the substrate. This is notably the case when the substrate is a multi-layer substrate comprising a stack of conducting layers separated by insulating layers. In this case, a contact point of a test area is formed in the surface of the substrate and is connected to a component of a deep conducting layer by means of conductor filled vias which pass through the insulating layers.

In order to carry out the control measurements on the electronic circuits, a tool fitted with one or more microprobes is brought to the surface of the substrate to a distance close enough for the ends of the microprobes to make contact with the substrate. The microprobes take the form of fine metal strips which are pressed onto the surface of the substrate. These fine metal strips are generally flexible and are comparable to hair.

A micrometric displacement device, such as a micropositioner, is then actuated to cause a relative displacement of the probes and the substrate along the plane of the substrate. This displacement is intended to bring the ends of the probes into coincidence with the contact points on the test areas. The relative displacement movement of the probes and the substrate can be controlled by various devices, such as optical location systems or viewing systems that use a CCD camera.

The main difficulty that is apparent during the control operation of the circuits described above is positioning the ends of the probes exactly on the contact points. Incorrect positioning of the probes can cause erroneous control measurements. Another difficulty is to keep the ends of the probes on the contact points. This is attributed to the fact that the contact points protrude from the surface of the substrate.

To facilitate the positioning and holding of the microprobes on the contact points, the dimensions of the contact points are commonly increased. However, increasing the dimensions, and hence the area of metal contact points on the surface of the substrate, is accompanied by the creation of or the increase of parasitic capacitances.

In effect, the contact points of the test areas define capacitors with the other conductive parts of the integrated circuits of the substrate. These capacitors have a capacitance that increases with the area of the contact points. These capacitances are parasitic capacitances which modify and impair the behavior of electronic circuits. This problem is a particular nuisance for electronic circuits operating at high frequency.

On the other hand, when the dimensions of the contact points are reduced so as to limit the parasitic capacitances, expensive equipment for adjusting the probes on the contact points must be installed and good electrical contact between the probes and the contact points is not always guaranteed. Furthermore, location of contact points of small dimensions on the surface of the substrate proves to be difficult.

SUMMARY OF THE INVENTION

An object of the invention is to provide a type of test area for electronic circuits that resolves the difficulties mentioned above. A particular object is to provide a test area that permits easy and automatic adjustment of the microprobes on the contact points without having to use complex and expensive alignment devices.

Another object of the invention is to provide test areas that guarantee that the ends of the microprobes are held on the contact points. A further object of the invention is to provide test areas in which location on the surface of the substrate is facilitated. A still further object of the invention is to provide a particularly simple and inexpensive method for producing test areas.

In order to achieve these objectives, a more precise aspect of the invention is to provide a test area for an electronic circuit comprising a contact point formed on the surface of the substrate, and guide means displaced on the surface of the substrate for guiding a test probe towards the contact point. In the context of this description, an electronic circuit is understood to mean both complete and complex circuits and portions of a circuit comprising one or more electronic components.

Because the guide means are arranged on the surface of the substrate, they are sufficient for the probes to come close to the contact point such that they rest against the guide means. In effect, whenever a probe is resting against the guide means for a contact point, any displacement, however imprecise, of the probe in the direction of the contact point results in the end of the probe automatically making contact with the contact point.

Because of this characteristic, contact points having a very small surface area can be created without compromising the ease of positioning the microprobes on the points. By reducing the surface area of the points, the size of the parasitic capacitances that the contact points are capable of generating is also reduced.

According to one particular embodiment, the guide means comprises, in proximity to the contact point, at least one elongated boss formed on the surface of the substrate that is oriented towards the contact point. In particular, the guide means may comprise a plurality of elongated bosses arranged in a radial fashion around the contact point.

By being arranged all around the contact point, the guide bosses permit, to a certain extent, that when the end of a probe is applied onto a contact point, it does not slide to the side of this point. Hence they constitute, in a way, means of locking the probe onto the contact point. This function can be further improved, according to another particular aspect of the invention, when the contact point is designed in such a way as to form a depression in relation to the surface of the substrate.

The elongated bosses can have a metal core, preferably insulated from the contact point. They can furthermore have an insulating covering in the form of a passivation layer. The insulating covering, has for example, a surface layer of silicon nitride. The surface layer of silicon nitride provides not only good electrical insulation properties, but also good resistance to abrasion and wear.

An object of the invention is also an electronic circuit including one or more test areas of the kind described herein. Another object of the invention is a method of producing a test area of an electronic circuit on a surface of a substrate. The method preferably comprises the following steps:

a) forming on the surface of the substrate of a layer of electrically conducting material in electrical contact with at least one part of an electronic circuit of the substrate;

b) shaping the layer of electrically conducting material to define a contact point in electrical contact with part of the electronic circuit, and to define elongated bosses surrounding the contact point and extending radially towards the contact point;

c) forming an insulating layer covering the layer of shaped electrically conducting material; and d) opening an access window to the contact point in the insulating layer. Preferably, for reasons of alignment, the access window can be created with dimensions smaller than the dimensions of the contact point.

BRIEF DESCRIPTION OF THE DRAWINGS

Other characteristics and advantages of the invention will emerge more clearly in the description which follows that makes reference to the appended drawings. This description is given for purely illustrative purposes only and is non-limitative.

DETAILED DESCRIPTION OF THE PREFERRED EMBODIMENTS

Figure 1:
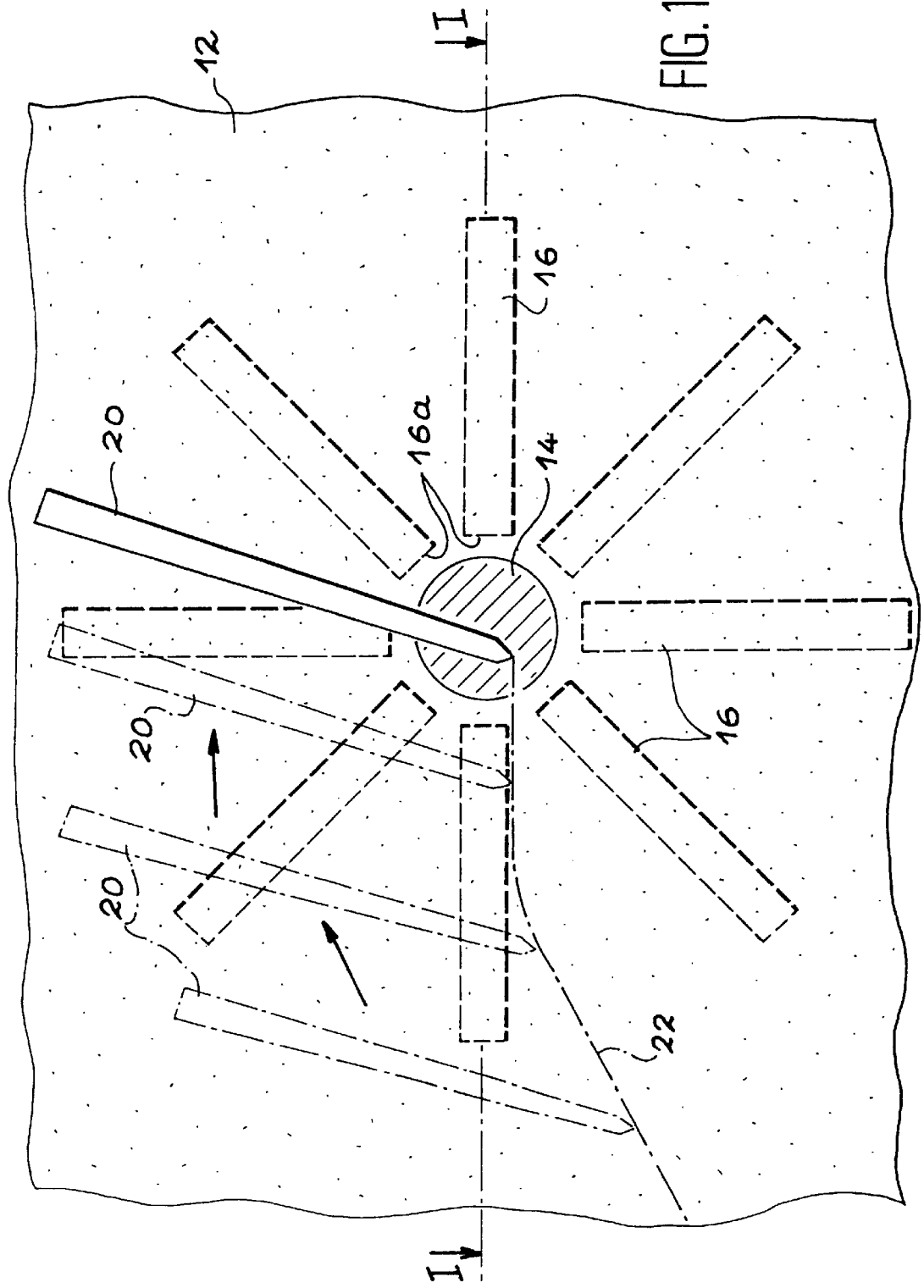
FIG. 1 is a top view of a test area according to the invention.
Figure 2:
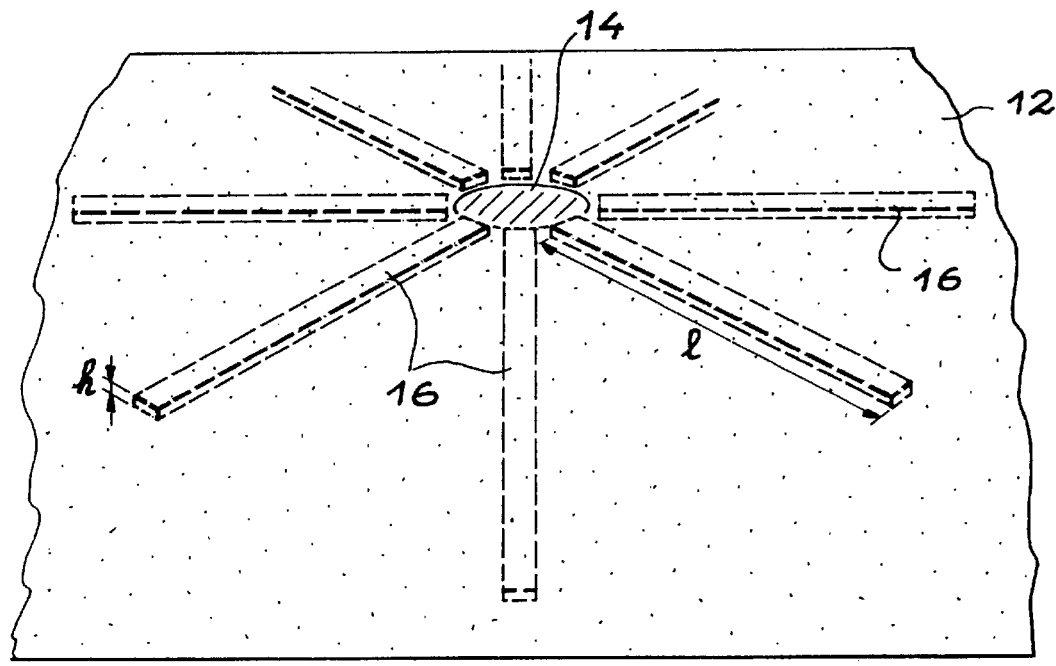
FIG. 2 is a perspective view of a detail of a test area according to the invention.
Figure 3:
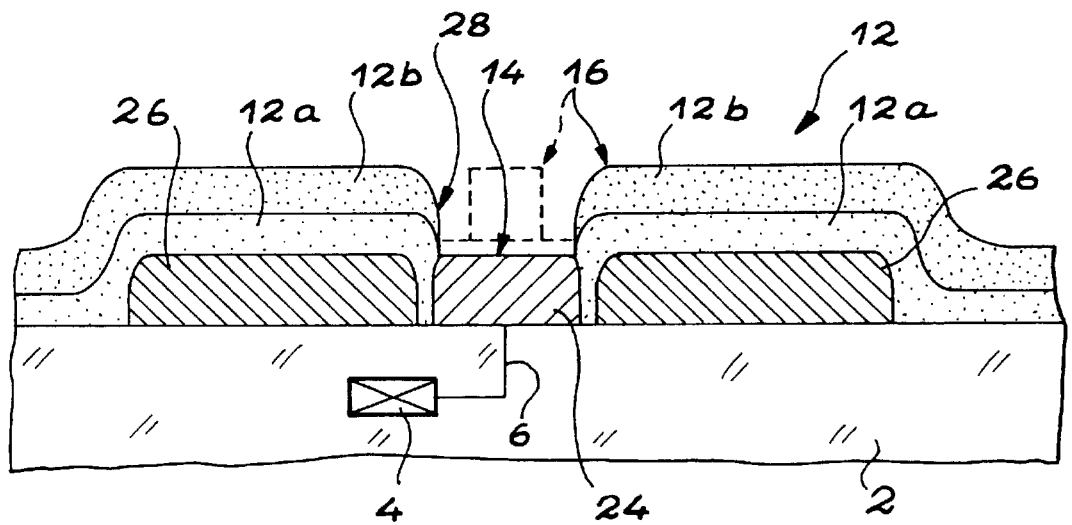
FIG. 3 is a section along the line I—I of the test area illustrated in FIG. 1.

In FIGS. 1–3 as described below, identical or similar parts respectively carry the same reference numbers. Reference number 12 in FIG. 1 represents a layer of insulating material, called a passivation layer, which covers a surface of a substrate comprising one or more integrated circuits. One or more test areas are formed on this surface that allow the correct operation of the circuits and the components integrated into the substrate to be checked.

The description which follows relates more particularly to one of the test areas. The test area includes one substantially round central contact point 14 formed by the surface of a metal disc with a diameter on the order of 4–5 $\mu$m. The limits of the contact point 14 are defined by a circular opening made in the passivation layer 12 above the metal disc, part of which is thereby exposed.

The contact point is surrounded, in the example described, by eight elongated rectangular bosses 16. These bosses 16 are arranged in proximity to the contact point 14 and are oriented radially towards the center of the point 14. The bosses 16, also covered with the passivation layer 12, form projections on the surface of the substrate.

As illustrated in FIG. 1, the bosses 16 are regularly spaced and their ends 16a are directed towards the contact point 14. The ends 16a are sufficiently spaced apart from each other to allow the passage of a microprobe sliding on the surface of the substrate.

Reference number 20 indicates a microprobe displaced on the surface of the substrate which has reached the contact point 14. The end of the microprobe 20 illustrated in FIG. 1 is in electrical contact with the contact point 14. Also illustrated in FIG. 1 and shown in broken lines are previous positions of the microprobe 20. These previous positions of the probe and the arrows allow the displacement of the microprobe 20 relative to the substrate to be shown. Furthermore, the path 22 followed by the end of the microprobe 20 on the surface of the substrate is represented by a line of alternate dots and dashes.

Still referring to FIG. 1, the microprobe 20 is initially moved in an approximate fashion towards the test area. Then, after having come up against a boss 16, the direction of movement of the microprobe 20 is changed so that it is guided directly towards the center of the test area onto the contact point 14.

It is apparent that in the absence of the bosses 14, the initial path of the microprobe 20 risks causing the end of the probe to pass to the side of the contact point 14. The role of the bosses 16 therefore becomes more clearly apparent. By coming into contact with the bosses 16, the end of the probe slides towards the contact point 14 in spite of the movement of the probe towards the center of the test area being approximate.

Furthermore, the proximal ends 16a of the bosses 16 surrounding the contact point 14 avoid, to a certain extent, the end of the microprobe 20 escaping from the contact point 14. The end of the microprobe 20 is also held on the contact point 14 by the passivation layer 12 and more precisely by the edges of the opening made in the passivation layer 12 at the site of the contact point 14. The contact point 14 forms, in effect, a depression in relation to the passivation layer 12 that surrounds it.

FIG. 2 illustrates a perspective view of a portion of the surface of the substrate and allows the protruding nature of the bosses 16 on the surface of the substrate to be made more apparent. In the figure, the height and the length of the guide bosses 16 are indicated respectively by the letters h and l. The height h of the bosses is, for example, on the order of 1 $\mu$m and their length l is on the order of 10–15 $\mu$m.

Hence, the entire test area has a diameter on the order of 25–35 $\mu$m. The test area is thus easily locatable despite the small dimensions of the central contact point 14. A central point having a small surface area can be produced. As a consequence, the small surface area has a low parasitic capacitance.

Furthermore, the star arrangement of the eight bosses 16 around the central point 14 form between them an angle difference of 45°. Such a non-orthogonal pattern can be easily located on the surface of the substrate. In effect, the elements of an integrated circuit visible on the surface of a substrate are generally laid out in an orthogonal network. In relation to such a network, non-orthogonal patterns can be easily identified. In a general way, the location of the test area can be facilitated whenever at least two bosses 16 form between them an angle difference of 90°.

FIG. 3 enables the structure and the formation of the bosses 16 on the surface of the substrate 2 to be better understood. It shows, in section, two bosses 16 arranged on either side of the central contact point 14. Reference number 2 designates a substrate in which an electronic circuit 4 is formed. The circuit 4 being represented in a very diagrammatic way.

On this substrate 2, a metal layer of aluminium or copper, for example, is formed. This layer is shaped by etching so as to define a central portion 24 intended to form the contact point 14, and so as to also define peripheral elongated pavings which respectively form a core 26 for each boss 16. It should be noted that the metal cores 26 of the bosses 16 are electrically insulated from the central portion 24.

Furthermore, line 6 represents an electrical connection between a particular point of the integrated electronic circuit 4 and the metal central portion 24. A layer of insulating material 12, called a passivation layer, is then formed over the whole of the structure. That is, over the metal patterns and over that part of the substrate 2 lacking any relief. To be more precise, in the embodiment illustrated in FIG. 3, the passivation layer 12 comprises two sublaers 12a and 12b formed in that order on the substrate 2.

The first sublayer 12a is an electrically insulating layer of silicon oxide. The second sublayer 12b comprises the upper layer of the structure and is silicon nitride. This material is chosen particularly for its electrical insulation properties and its resistance to wear, so as to allow easy sliding of the microprobes 20 over the substrate 2.

Finally, an opening 28 is made in the passivation layer 12. That is, the opening 28 is made in the two sublayers 12a and 12b to the metal portion or base 24. The opening 28 allows the upper part of the metal portion that forms the contact point 14 to be exposed.

That which is claimed is:

1. A test area for an electronic circuit, comprising:
   a substrate;
   a contact point on a surface of the substrate; and
   at least one elongated boss on the surface of the substrate in proximity to the contact point, and being oriented towards the contact point for guiding a test probe positioned on the surface of the substrate towards said contact point.

2. A test area according to claim 1, wherein the at least one elongated boss comprises a plurality of elongated bosses arranged in a radial fashion around the contact point.

3. A test area according to claim 2, wherein the plurality of bosses are angularly spaced with a substantially regular spacing.

4. A test area according to claim 3, wherein at least two of the elongated bosses form between them an angle less than 90°.

5. A test area according to claim 1, wherein the contact point is substantially circular.

6. A test area according to claim 1, wherein the contact point is surrounded by a layer of insulating material.

7. A test area according to claim 1, wherein each of the bosses comprises a surface layer of silicon nitride.

8. A test area according to claim 1, wherein each of the bosses comprises a metal core.

9. An electronic circuit comprising:
   a substrate; and
   at least one test area on said substrate and comprising:
   a contact point formed on a surface of the substrate; and
   at least one boss adjacent to the contact point for guiding a test probe positioned on the surface of the substrate towards said contact point.

10. An electronic circuit according to claim 9, wherein the at least one boss comprises a plurality of elongated bosses.

11. An electronic circuit according to claim 10, wherein the plurality of elongated bosses are arranged in a radial fashion around the contact point.

12. An electronic circuit according to claim 10, wherein each of the bosses are angularly spaced with a substantially regular spacing.

13. An electronic circuit according to claim 10, wherein at least two of the elongated bosses form between them an angle less than 90°.

14. An electronic circuit according to claim 9, wherein the contact point is substantially circular.

15. An electronic circuit according to claim 9, wherein the contact point is surrounded by a layer of insulating material.

16. An electronic circuit according to claim 9, wherein each of the bosses comprises a surface layer of silicon nitride.

17. An electronic circuit according to claim 9, wherein each of the bosses comprises a metal core.

18. A method for producing a test area on a surface of a substrate of an electronic circuit, comprising the steps of:
   forming on the surface of the substrate a layer of electrically conducting material in electrical contact with the electronic circuit;
   shaping the layer of electrically conducting material for defining a contact point in electrical contact with the electronic circuit;
   forming a plurality of elongated bosses surrounding the contact point which extend radially towards the contact point;
   forming an insulating layer covering the layer of shaped electrically conducting material; and
   opening an access window to the contact point in the insulating layer.

19. A method according to claim 18, wherein the plurality of elongated bosses are electrically insulated from the contact point.

20. A method according to claim 18, wherein the step of forming an insulating layer comprises forming a layer of silicon oxide covered with a layer of silicon nitride.

21. A method according to claim 18, wherein the step of opening an access window is produced to have dimensions smaller than dimensions of the contact point.

22. A method for producing a test area on a surface of a substrate of an electronic circuit, comprising the steps of:
   forming a contact point on a surface of the substrate;
   forming at least one boss on the surface of the substrate in proximity to the contact point, and being oriented towards the contact point; and
   providing means for guiding a test probe positioned on the surface of the substrate towards the contact point.

23. A method according to claim 22, wherein the step of forming at least one boss comprises the step of forming a plurality of elongated bosses arranged in a radial fashion around the contact point.

24. A method according to claim 23, comprises the step of angularly spacing the plurality of elongated bosses with a substantially regular spacing.

* * * * *

UNITED STATES PATENT AND TRADEMARK OFFICE
CERTIFICATE OF CORRECTION

PATENT NO. : 6,211,688 B1
DATED : April 3, 2001
INVENTOR(S) : Michel Vallet

It is certified that error appears in the above-identified patent and that said Letters Patent is hereby corrected as shown below:

Column 5,
Line 2, delete: "90°" insert -- less than 90° --

Signed and Sealed this

Twenty-fifth Day of September, 2001

Attest:

*Nicholas P. Godici*

NICHOLAS P. GODICI
*Acting Director of the United States Patent and Trademark Office*

*Attesting Officer*